United States Patent
Burns et al.

[11] Patent Number: 5,849,359
[45] Date of Patent: Dec. 15, 1998

[54] VARIABLE TILTING TUMBLER VACUUM COATING APPARATUS

[75] Inventors: Steven M. Burns, Waterbury; Richard William Varsell, Bristol, both of Conn.

[73] Assignee: United Technologies Corporation, Hartford, Conn.

[21] Appl. No.: 895,980

[22] Filed: Jul. 17, 1997

[51] Int. Cl.$^6$ .............. B05D 3/12; B05C 11/02; B05C 13/02

[52] U.S. Cl. .............. 427/242; 427/240; 427/255.5; 427/425; 118/52; 118/301; 118/319; 118/320; 118/503; 118/505; 118/721; 118/730

[58] Field of Search .............. 427/240, 242, 427/255.5, 425; 118/730, 52, 301, 319, 320, 503, 505, 720, 721; 414/223, 225

[56] References Cited

U.S. PATENT DOCUMENTS

| | | | |
|---|---|---|---|
| 3,993,297 | 11/1976 | Tokunaga | 269/54.4 |
| 4,271,005 | 6/1981 | Wright et al. | 204/298 |
| 4,612,207 | 9/1986 | Jansen | 427/39 |
| 4,775,555 | 10/1988 | Duffy | 427/183 |
| 5,378,284 | 1/1995 | Geisler et al. | 118/723 MR |
| 5,421,979 | 6/1995 | Stevenson | 204/298.25 |
| 5,565,035 | 10/1996 | Sylvestro et al. | 118/721 |

*Primary Examiner*—Shrive Beck
*Assistant Examiner*—Michael Barr
*Attorney, Agent, or Firm*—Bachman & LaPointe, P.C.

[57] ABSTRACT

The present invention relates to an apparatus for simultaneously coating a plurality of workpieces. The apparatus includes a modular fixture having a plurality of bushing and spindle arrangements for supporting the workpieces to be coated. The bushing and spindle arrangements allow each workpiece to rotate about its longitudinal axis. They further allow each workpiece to assume a first position where it is tilted towards a source of coating material during a first portion of the coating cycle and a second position substantially parallel to the source of coating material during a second portion of the coating cycle. By providing the novel bushing and spindle arrangement of the present invention, it is possible to coat surfaces of the workpiece which are substantially perpendicular to other surfaces of the workpiece and still obtain a substantially uniform coating along the other surfaces of the workpiece. A process for simultaneously coating the workpieces is also described. The process broadly comprises the steps of providing a source of coating material, attaching a workpiece to be coated to a fixture, and coating the workpiece with a coating material by rotating the fixture and thereby causing the workpiece to be tilted towards the source of coating material during a first portion of the coating cycle and to be substantially parallel to the source of coating material during a second portion of the coating cycle.

31 Claims, 7 Drawing Sheets

VARIABLE TILTING TUMBLER VACUUM COATING APPARATUS

CROSS REFERENCE TO RELATED APPLICATIONS

This application is related to U.S. patent application Ser. No. 08/813,384 to Steven M. Burns and William A. Nehez, Sr., filed Mar. 6, 1997, for a MODULAR COATING FIXTURE.

BACKGROUND OF THE INVENTION

The present invention relates to a fixture to be used in an apparatus for coating workpieces and to a process for coating the workpieces. The present invention has particular utility in the coating of vanes and blades for industrial turbines and jet engines.

Vanes and blades used in industrial turbines and jet engines are typically subjected to a coating operation to improve their resistance to corrosion, thermal fatigue, and to otherwise enhance their performance. Economic concerns dictate that one must be able to simultaneously coat multiple workpieces in order to have a viable commercial process.

One commercial system for simultaneously coating a plurality of workpieces is shown in U.S. Pat. No. 4,192,253. In this system, a plurality of workpieces to be coated are inserted into a coating chamber and simultaneously rotated about their longitudinal axes during the coating operation. The simultaneous rotation of the workpieces about their longitudinal axes is accomplished by mounting each workpiece to the tip of a fixture whose other end is connected to a complex gear operated drive system for rotating the fixture and the individual workpieces mounted thereto. This type of system is disadvantageous for a number of reasons. For example, the system is complex and potentially troublesome from a maintenance standpoint. Still further, the costs associated with such a system are quite high. Yet, another disadvantage is the delay incurred in individually removing the coated workpieces from each of the fixtures and mounting new workpieces to be coated onto the fixtures.

More recently, it has been proposed to coat multiple workpieces at a single time using a modular fixture arrangement. Such a coating system is illustrated in copending U.S. patent application Ser. No. 08/782,398, filed on Jan. 13, 1997, to John W. Menchetti et al., entitled MODULAR COATING FIXTURE, and assigned to the Assignee of the present application.

Certain coating techniques, such as electron beam physical vapor deposition, are line of sight techniques wherein surfaces of a workpiece which are not in a line of sight with the source of the coating material will not be coated. Thus, there still remains a need for an apparatus and process which enables one to coat surfaces, such as platforms on airfoils, which are perpendicular or nearly perpendicular to other surfaces of a workpiece to be coated. Additionally, such an apparatus must facilitate the formation of a substantially uniform coating along the workpiece.

SUMMARY OF THE INVENTION

Accordingly, it is a principal object of the present invention to provide a modular fixture which facilitates the simultaneous coating of multiple workpieces.

It is a further object of the present invention to provide a fixture as above which enables the coating of surfaces which are positioned at an angle relative to each other.

It is still a further object of the present invention to provide a fixture as above which allows flow surfaces of the airfoil to be substantially uniformly coated.

It is still another object of the present invention to provide a fixture as above which allows a more rapid part changeover and which is economically viable.

It is yet a further object of the present invention to provide an improved method for coating workpieces such as turbine blades and vanes.

The foregoing objects are attained by the modular fixture and the process of the present invention.

In accordance with the present invention, an apparatus for coating one or more workpieces broadly comprises a modular fixture, which fixture includes a means for causing the workpiece to tilt towards a source of coating material during a first portion of a coating cycle and for causing the workpiece to be substantially parallel to the source of coating material during a second portion of the coating cycle. The fixture further includes a central shaft and two support platens attached to the central shaft. The means for causing the workpiece to tilt towards the source of coating material during the first portion of the coating cycle and for causing the workpiece to be substantially parallel to the source of coating material during the second portion of the coating cycle comprises a plurality of canted bushings in the support plates and a plurality of cooperating spindle arrangements. The bushings and spindle arrangements allow each workpiece to rotate about its longitudinal axis as the fixture rotates about its longitudinal axis and allow each workpiece to assume different positions relative to the coating source during the coating cycle. By providing the canted bushing and spindle arrangements, it is possible to provide the flow surfaces of the airfoil with a substantially uniform coating as well as provide surfaces, such as a platform, which are perpendicular, or nearly perpendicular to the flow surfaces, with a coating. The use of the canted bushing and spindle arrangement of the present invention also provides the advantage that one is able to coat longer workpieces with the fixture of the present invention.

The process of the present invention broadly comprises the steps of providing a source of coating material; attaching a workpiece to be coated to a fixture; and coating the workpiece with the coating material by rotating the fixture about its longitudinal axis and thereby causing the workpiece to be tilted towards the source of the coating material during a first portion of the coating cycle and to be substantially parallel to the source of coating material during a second portion of the coating cycle.

Other details of the apparatus and the process of the present invention, as well as other objects and advantages attendant thereto, are set forth in the following detailed description and the accompanying drawings in which like reference numeral depict like elements.

DETAILED DESCRIPTION OF THE PREFERRED EMBODIMENT(S)

Figure 1:
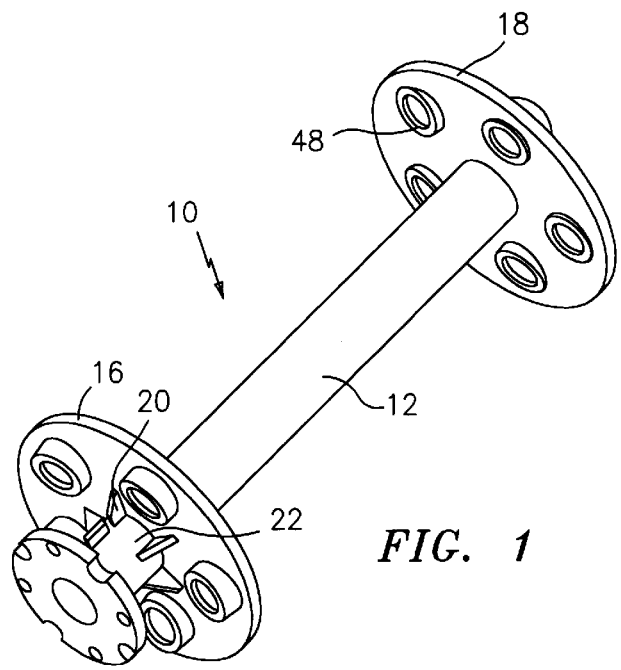
FIG. 1 is a perspective view of a modular fixture in accordance with the present invention.

Referring now to the drawings, FIG. 1 illustrates a modular coating fixture in accordance with the present invention. As shown therein, the fixture 10 includes a central shaft 12 which extends in a direction parallel to the longitudinal axis 14 of the fixture 10. The fixture 10 further includes two spaced apart support plates 16 and 18 which are preferably welded to the shaft 12. If desired, the support plates 16 and 18 may be secured to the shaft 12 by a plurality of supports 20 welded to the shaft 12 at various locations about its periphery and welded to the support plates 16 and 18. The shaft 12 is preferably hollow to save weight.

Figure 2:
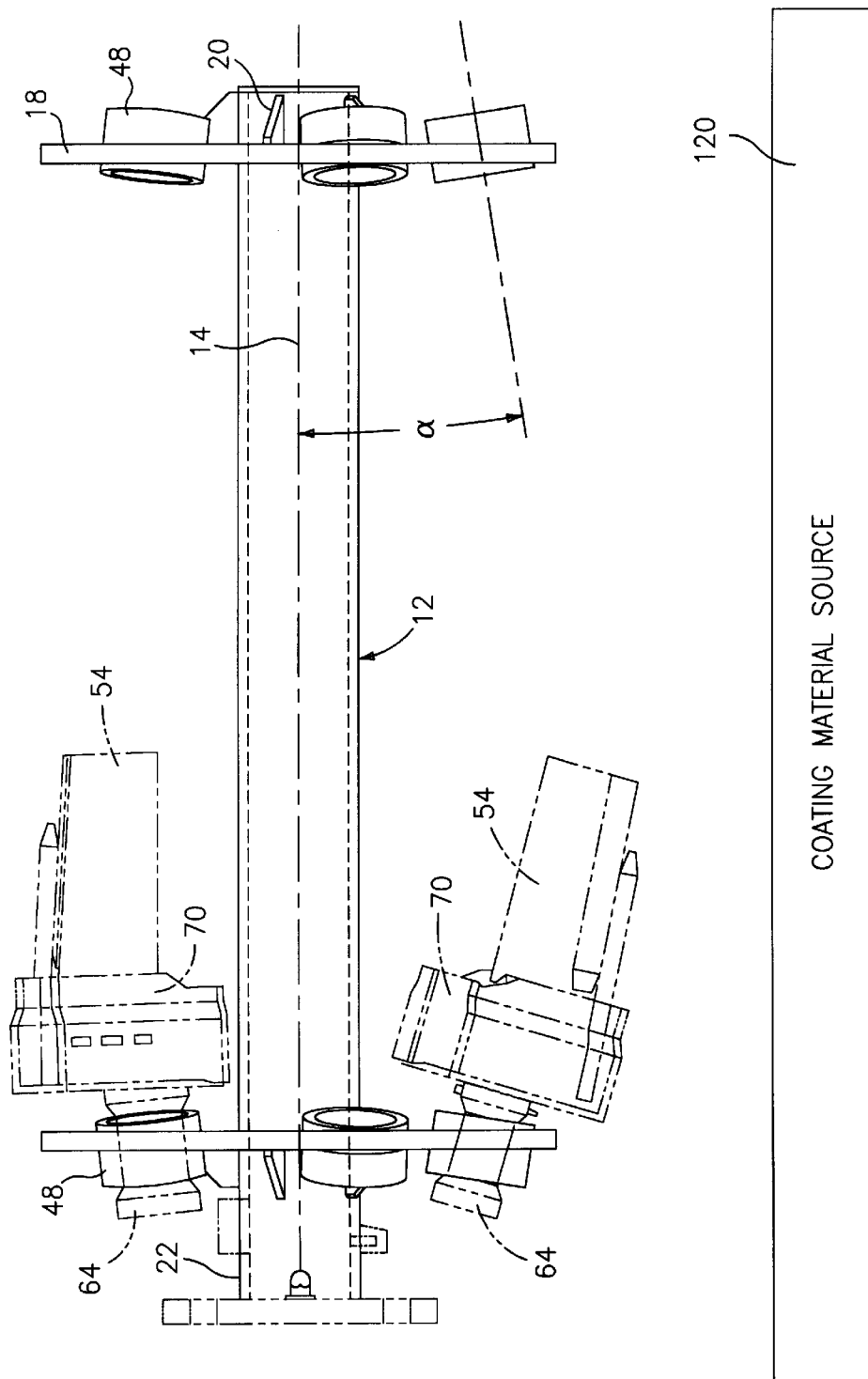
FIG. 2 is a side view of the modular coating fixture of FIG. 1.
Figure 3:
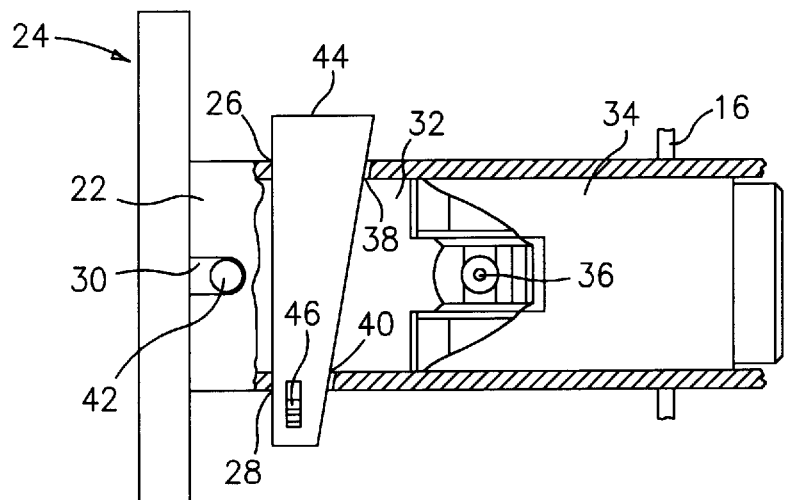
FIG. 3 is a top view in partial cross-section of a connecting member used to connect the fixture of FIG. 1 to a drive shaft.

As shown in FIG. 2, a cylindrical mounting column 22 protrudes from one end of the fixture 10. The mounting column 22 may be an extension of shaft 12 or a separate component welded to one of the support plates 16 and 18. The mounting column 22 is hollow and designed to receive a mating portion 34 of a connecting member 24 affixed to a drive system (not shown) for rotating the fixture 10 about its longitudinal axis 14. Referring now to FIG. 3, the mounting column 22 is preferably provided with two aligned, opposed slots 26 and 28. Additionally, it has a keyway 30 adjacent one end thereof.

Figure 4:
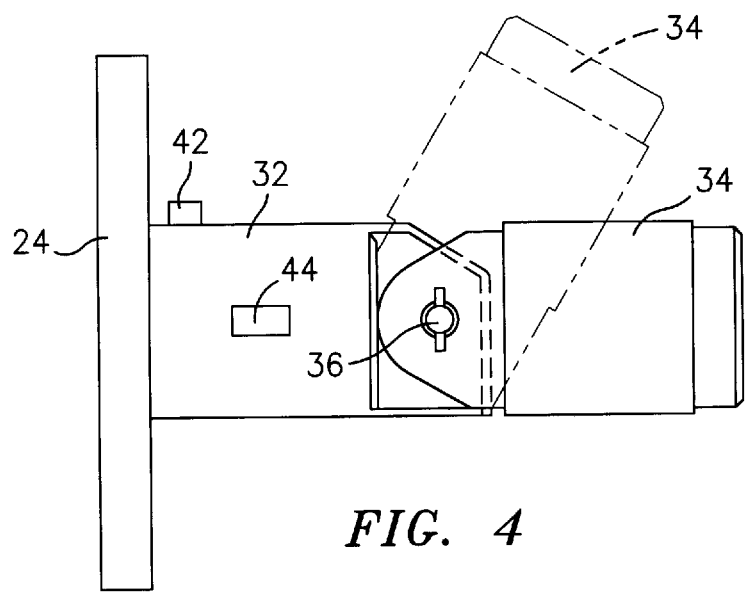
FIG. 4 is a side view of the connecting member of FIG. 3 showing it in a fixture receiving/unloading position.

Referring now to FIGS. 3 and 4, the connecting member 24 includes a base portion 32 and a shaft portion 34 which is joined to the base portion 32 by a pivot 36. As shown in FIG. 4, the pivot 36 allows the shaft portion 34 to be moved relative to the base portion 32 so as to facilitate installation and removal of the fixture 10 therefrom. The shaft portion 34 is dimensioned to fit within the hollow mounting column 22. The base portion 32 is provided with two slots 38 and 40 for mating with the slots 26 and 28 in the column 22. Furthermore, the base portion 32 has a key 42 which fits into the keyway 30 to ensure that the slots 38 and 40 are properly aligned within the slots 26 and 28.

To secure the fixture 10 to the connecting member 24, a wedge 44 is inserted through the slots 26, 38, 40 and 28. The wedge 44 preferably has an eyelet 46 adjacent one end for receiving a wire (not shown) to lock it in place.

Figure 5:
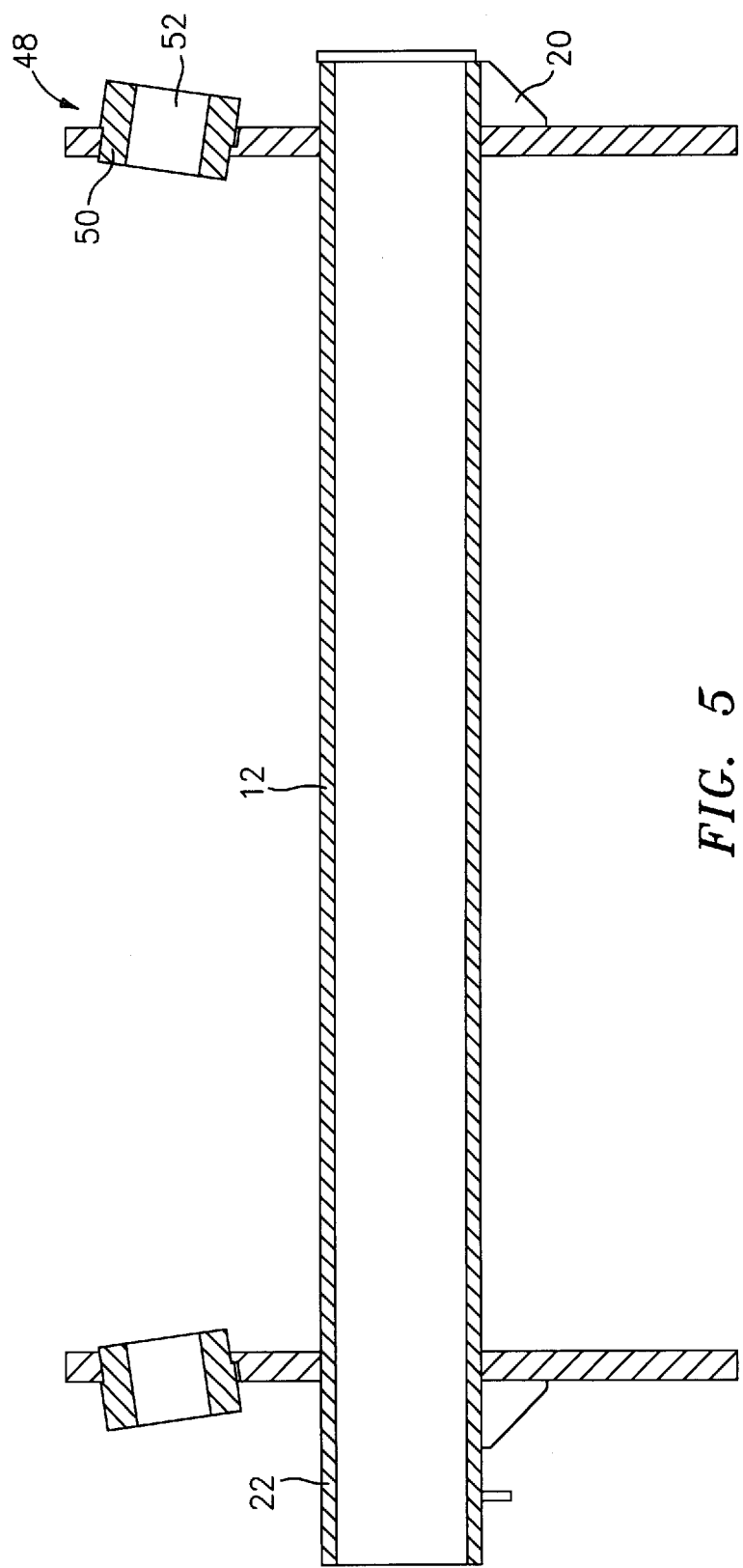
FIG. 5 is a side view in partial cross-section of the modular fixture of FIG. 1.

Referring now to FIGS. 1 and 2, a plurality o f bushings 48 are radially spaced about each of the support plates 16 and 18. The number of bushings 48 in each support plate and the spacing of the bushings 48 relative to the shaft 12 are determined by the type of workpiece or workpieces 54 to be coated. As shown in FIG. 5, the bushings 48 are formed by a hollow cylindrically shaped sleeve member 50 welded on two sides to the respective support plate 16 or 18. The bushings 48 are canted relative to the support plates and relative to the longitudinal axis 14 of the fixture 10. The canting angle a relative to the axis 14 may be any suitable angle which tilts the workpiece to be coated towards a source of coating material at a desired angle during a first part of the coating cycle and which also places the part being coated substantially parallel to the source of coating material during a second portion of the coating cycle. Suitable canting angles are in the range of 1°–16°. A preferred cant angle is about 8°. As shown in FIG. 2, when one looks at the fixture 10 from the side, one can see the bushing and spindle arrangement above the shaft 12 holding the workpiece 54 in a position substantially parallel to the source of coating material and the bushing and spindle arrangement at a position beneath the shaft 12 holding the workpiece 54 to be coated so that it tilts towards the source of coating material.

The interior bore 52 of the sleeve member 50 preferably has a circular shape which allows the foregoing positions of the workpiece 54 to be accomplished during the coating cycle. The surfaces of the bore 52 are preferably roughened for reasons which will be discussed hereinafter.

During the coating operation, it is necessary for the workpiece 54 being coated to rotate about its longitudinal axis 122 so that multiple surfaces of the workpiece, such as the leading edge 56 and the opposed flow surfaces 58 and 60 are substantially uniformly coated. It is also desirable in many applications for a surface 62 substantially perpendicular to the flow surfaces 58 and 60 to be coated as well. In line of sight coating processes, such as electron beam physical vapor deposition processes, it is necessary to tilt the workpiece 54 towards the source of the coating material 120 as the workpiece 54 is rotated about its longitudinal axis 122 in order to coat the surface 62. As previously discussed, the canting of the bushings 48 and the cooperating spindle arrangements 64 are designed to accomplish this result.

Figure 6:
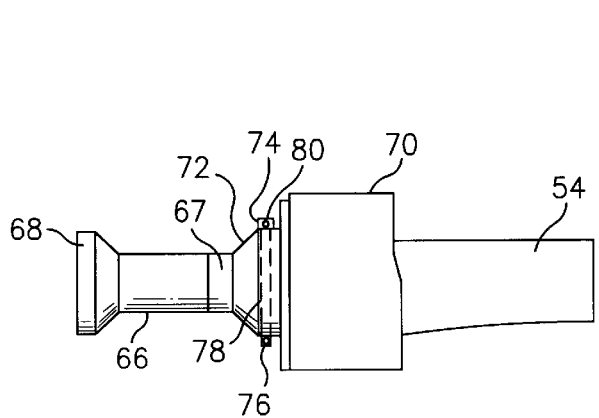
FIG. 6 is a side view of a spindle arrangement used in the modular fixture of FIG. 1.

Referring now to FIG. 6, each spindle arrangement 64 preferably comprises a pin 66 having a shaft portion 67 and an enlarged head portion 68, which head portion abuts against one end of the bushing 48 with which it is associated. The shaft portion 67 has a roughened surface and an exterior diameter which is smaller than the interior dimensions of the bore 52 so as to allow the pin 66 to tilt relative to the bushing 48. The diameter of the shaft portion 67 along with the length of the sleeve 50 and the dimension of bore 52 determine the various degrees of tilt during the coating cycle. The pin 66 further includes a reduced shaft portion 69 which fits into a cup-shaped member 72 which will be described hereinafter.

The workpiece 54 to be coated is attached to the spindle arrangement 64. As shown in FIG. 6, the workpiece 54 is attached to the pin 66 via a workpiece retaining device 70 and a connecting member 72 attached to one end of the retaining device. The connecting member 72 may be attached to the retaining device 70 by any suitable means known in the art such as by welding. The connecting member 72 includes two opposed openings 74 and 76 for mating with a slot 78 in an end of the shaft portion 69. A pin or wedge-shaped member 80 is inserted through the opening 74, through the slot 78, and through the opening 76 to secure the cup-shaped member 72 to the pin 66. The pin or wedge-shaped member 80 is designed to securely affix the retaining device 70 to the spindle arrangement 64.

Figure 7:
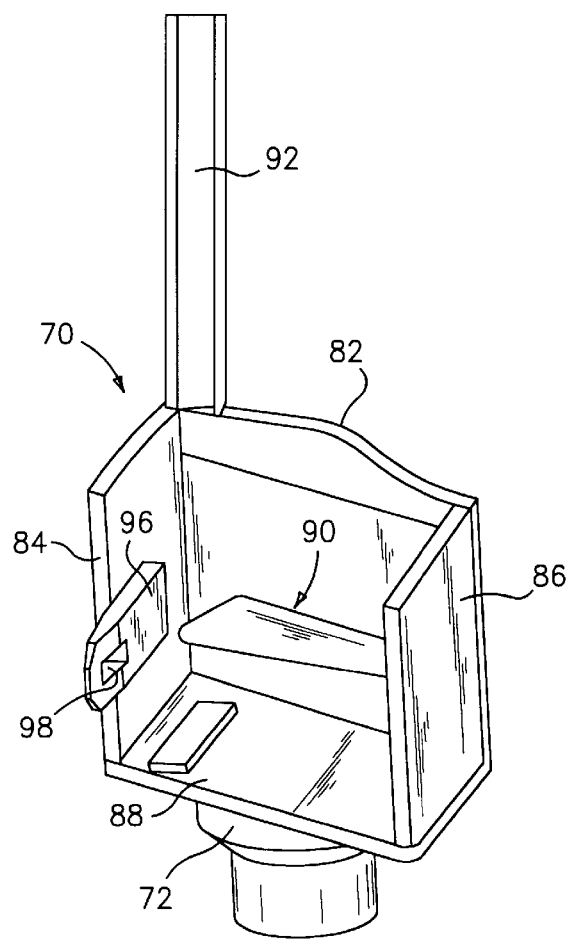
FIG. 7 is a front view of a workpiece retaining device used with the modular fixture of the present invention.

The retaining device 70, as shown in FIG. 7, is an open-faced and open-ended structure which includes a back wall 82 and two side walls 84 and 86 joined thereto. The retaining device 70 further includes a bottom wall which connects the two side walls 84 and 86. The workpiece 54 to be coated is placed within the retaining device 70 via the open face defined by the side walls 84 and 86, the back wall 82 and the bottom wall 88. Once positioned within the retaining device 70, the portion of the workpiece 54 to be coated extends through the open end located opposite the bottom wall 88. Where the workpiece 54 has a surface 62 such as a platform to be coated, the side walls 84 and 86 and the back wall 82 are shaped and/or configured to conform to the shape of the surface 62. If desired, the back wall 82 may be provided with a support plate 90 for holding the workpiece 54 in a desired position. The support plate 90 preferably cooperates with a feature on the workpiece 54 such as a ribbed portion or a notch (not shown), to hold it in the desired position.

A masking device 92 may be mounted to the back wall 82 and/or to a side wall 84 to prevent certain portions of the workpiece 54, such as a trailing edge 94, from being coated. The masking device 92 may have any suitable shape and length. For example, it may be L-shaped. Of course, the shape of the masking device 92 will depend on the shape of that portion of the workpiece 54 not to be coated.

A tongue member 96 is secured, such as by welding, to the interior side of side wall 84. The tongue member 96 has a slot 98 cut therein and serves to secure a cover 100 to the retaining device 70.

Figure 8:
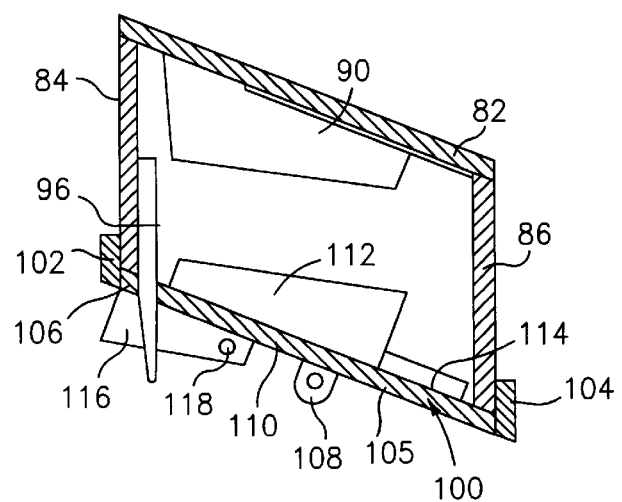
FIG. 8 is a sectional view of the workpiece retaining device of FIG. 7 showing a cover secured in place.

Referring now to FIG. 8, the cover 100 has side portions 102 and 104 which overlap the side walls 84 and 86 when the cover is seated on the retaining device 70 and connecting portion 105 extending therebetween. The connecting portion 105 of the cover 100 includes a slot 106 through which the tongue member 96 protrudes. Still further, the connecting portion 105 of the cover 100 has an eyelet 108 attached to its exterior surface 110 and an optional support member 112 mounted to its interior surface 114. The support member 112 cooperates with a portion of the workpiece 54 to maintain the workpiece in a desired position within the retaining device 70.

Figure 9:
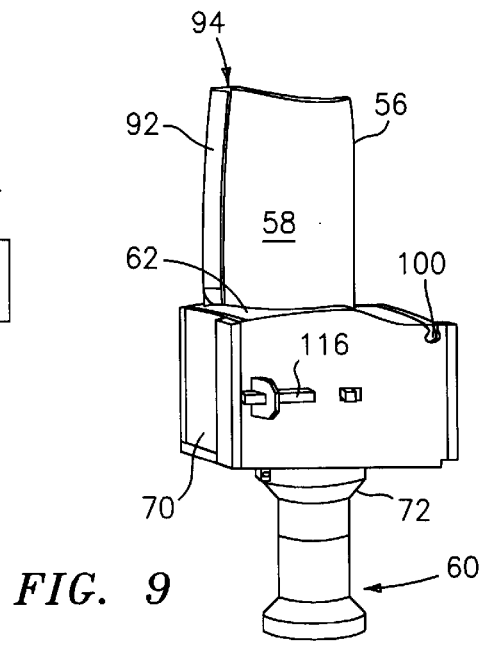
FIG. 9 is a perspective view of a vane-type workpiece positioned within the retaining device of FIGS. 7 and 8.

A wedge 116 is provided to secure the cover 100 to the retaining device 70. As shown in FIG. 8, the wedge 116 has a bore 118 adjacent one end thereof. When the wedge is placed into its securing position adjacent the exterior surface 114 of the cover, a wire (not shown) is passed through the bore 118 and the eyelet 108 so as to secure the wedge 116 in its proper position. FIG. 9 illustrates a workpiece secured within the retaining device 70.

The various components of the modular fixture 10 such as the shaft 12, the support plates 16 and 18, the mounting column 22, the retaining device 70, the bushings 48, and the spindle arrangements 64 may be formed from any suitable material known in the art. Preferably, they are formed from a material known as HASTALLOY-X.

The modular fixture 10 of the present invention is used in the following manner. First, a plurality of workpieces 54 to be coated are placed within the retaining devices 70. After the covers 100 have been secured in place, the modular fixture 10, with the workpieces 54 in place, is placed onto the connecting member 24 joined to a drive system (not shown). As previously described, the fixture 10 is secured to the connecting member 24 via the aligned slots 26, 28, 38 and 40 and the wedge 44 which passes through the slots. The fixture 10 after being secured to the connecting member 24 is transported into a coating chamber, such as an electron beam physical vapor deposition chamber, in which a coating material is vaporized via the application of heat in a known manner. The actual technique for causing the coating material to be vaporized does not form part of the present invention. The fixture 10 may be used with any number of different techniques.

Figure 10:
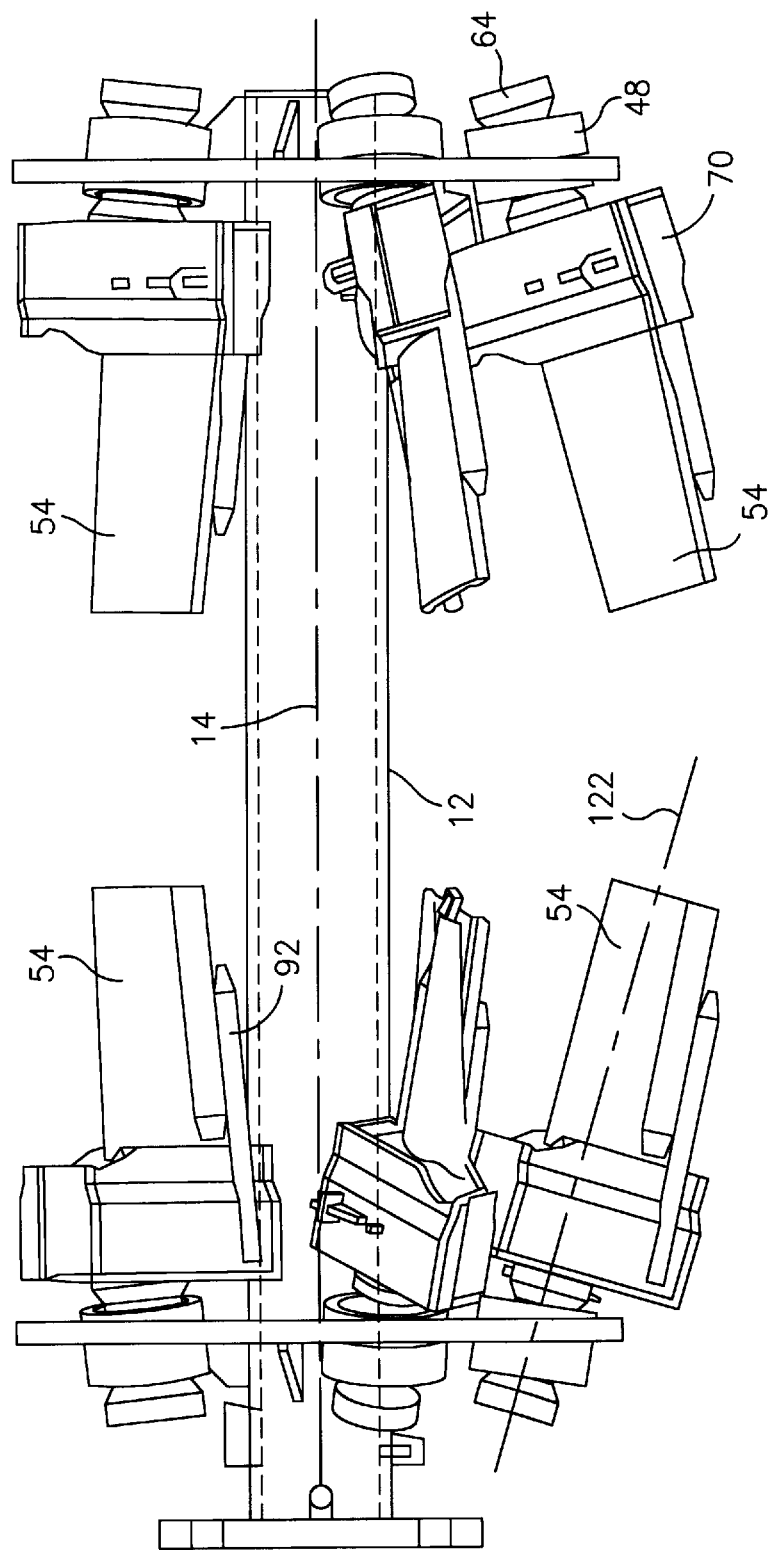
FIG. 10 is a side view of a plurality of vane-type workpieces positioned within the fixture of the present invention.
Figure 11:
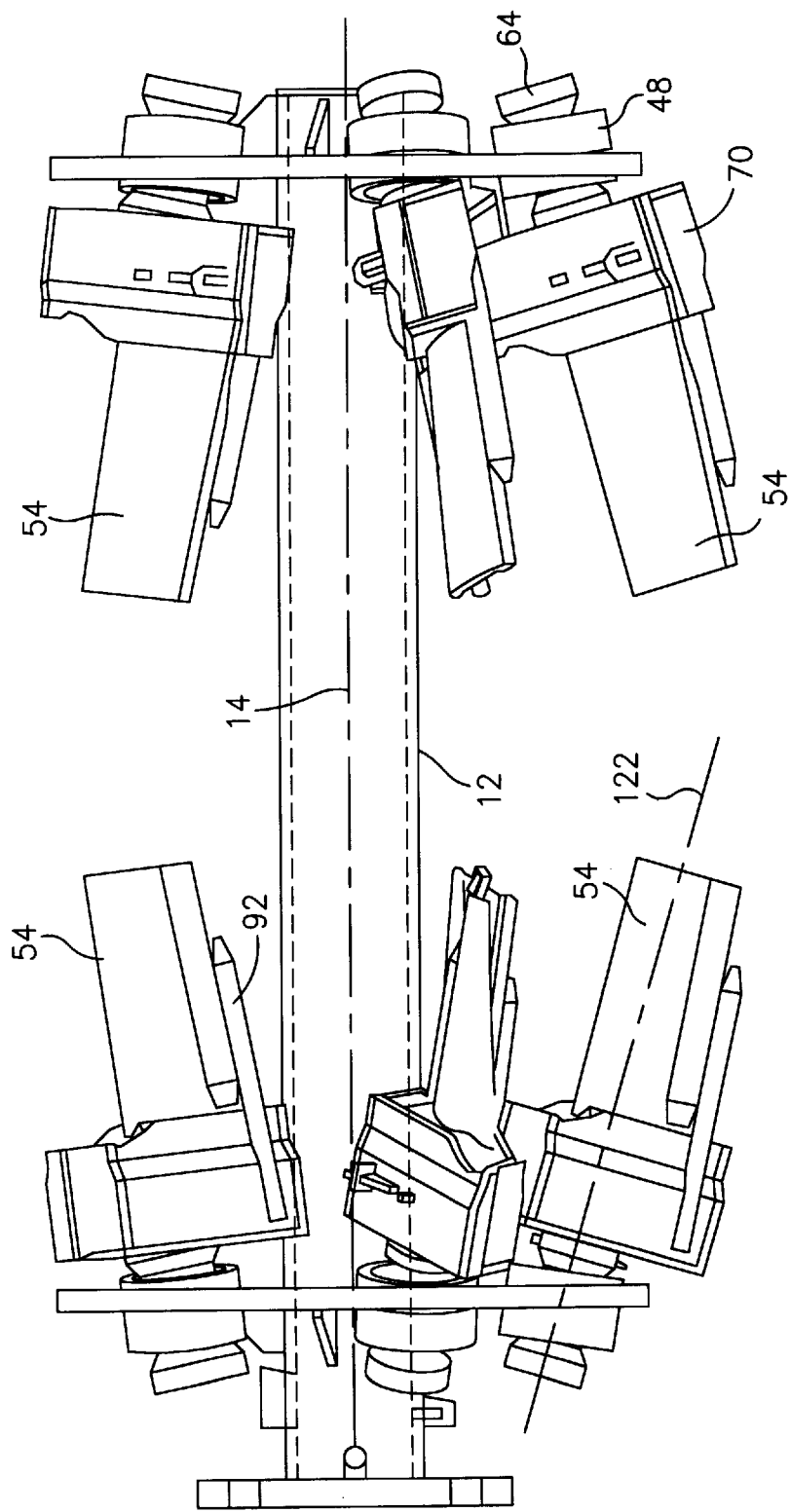
FIG. 11 is a side view of a plurality of work pieces positioned within the fixture of the present invention with the uppermost workpiece tilted away from a source of coating material.

During the coating operation, the modular fixture 10 is rotated about its longitudinal axis 14 by the drive system (not shown). As the fixture 10 is rotated, gravity and the presence of friction between each bushing 48 and cooperating spindle arrangement 64 causes each retaining device 70 and each workpiece 54 to rotate about the workpiece longitudinal axis 122. Rotation of the workpiece about its longitudinal axis results in the opposed flow surfaces 58 and 60 and the leading edge 56 of each workpiece are coated. As shown in FIGS. 1 and 10, at any point during the coating cycle, at least one of the workpieces 54 is tilted towards a source of coating material 120. As a result, any surface perpendicular to the flow surfaces 58 and 60, such as a platform surface 62, is exposed to the vaporized coating material and thereby coated. While workpieces 54 alongside and beneath the shaft 12 are tilted towards the source of coating material, the uppermost workpieces, those above the shaft 12, are positioned substantially parallel to the source of the coating material and to the longitudinal axis 14. This positioning of the uppermost workpieces is caused by gravity, the cant of each bushing 48, and the relationship between each bushing 48 and its spindle arrangement 64. Having the uppermost workpieces positioned substantially parallel to the source of the coating material during at least a portion of the coating cycle helps form a more substantially coating on the flow surfaces 58 and 60. It also provides the advantage that longer parts can be coated using the fixture of the present invention. This is because the uppermost workpieces at any point in the coating cycle do not significantly tilt towards the shaft 12. After the coating operation has been completed, the modular fixture 10 with the workpieces 54 attached thereto is removed from the coating chamber and a new fixture 10 with new workpieces 54 to be coated is installed.

In an alternative embodiment, one can cant the bushing 48 so that when the workpieces 54 reach a position above the shaft 12, they are tilted upwardly and away from the coating source 120. For example, the uppermost workpiece may tilt as much as 16° with respect to the longitudinal axis 14. Tilting the workpiece away from the coating source allows one to coat top portions of the workpieces such as the underside of a shroud at the top end of the workpiece. When the bushing 48 is canted in such a manner, each workpiece will be tilted towards the coating source during a first position of the coating cycle, will be parallel to the coating source during a second portion of the coating cycle, and will be tilted away from the coating source during a third portion of the coating cycle.

It can be seen from the foregoing description that the modular coating fixture of the present invention provides numerous commercial advantages. Most notably, the fixture allows the simultaneous coating of multiple workpieces. The fixture further allows easy placement of the workpieces therein and easy removal of the workpieces therefrom. Still further, the workpieces may be placed in the fixture and removed from the fixture while another set of workpieces are being coated on yet another fixture. Additionally, the fixture of the present invention is easier to use than prior art systems.

The fixture of the present invention has particular utility in coating airfoils such as turbine blades and vanes. By using the fixture of the present invention, it is possible to coat a platform portion of the turbine blade or vane as well as the leading edge and both flow surfaces.

The fixture of the present invention is relatively simple in design when compared to expensive gear driven systems. Further, it can produce a close to uniform coating thickness and excellent coating structure. Due to the simplistic design of the fixture of the present invention, coating can be accomplished at a much lower cost.

As previously discussed, the fixture of the present invention lends itself to coating longer parts. This is because the parts are only tilted down when along side of or below the central shaft 12 of the fixture.

It is apparent that there has been provided in accordance with the present invention a modular coating fixture which fully satisfies the objects, means, and advantages set forth hereinbefore. While the invention has been described in combination with specific embodiments thereof, it is evident that many alternatives, modifications, and variations will be apparent to those skilled in the art in light of the foregoing description. Accordingly, it is intended to embrace all such alternatives, modification, and variations as fall within the spirit and broad scope of the appended claims.

What is claimed is:

1. A process for coating a workpiece, said process comprising the steps of:
    providing a source of coating material;
    attaching a workpiece to be coated to a fixture by retention means which roll with respect to said fixture, said workpiece having a longitudinal axis; and
    coating said workpiece with said coating material said coating step comprising rotating said fixture about a rotational axis and thereby causing said retention means to roll with respect to said fixture and said workpiece to rotate about said longitudinal axis and further causing said workpiece to have its longitudinal axis tilted relative to said rotational axis and towards said source of coating material during a first portion of a coating operation and to have its longitudinal axis substantially parallel to said rotational axis during a second portion of the coating operation.

2. The process of claim 1 wherein said step of rotating said fixture comprises rotating said fixture about its longitudinal axis.

3. The process of claim 1 wherein said coating step comprises coating two opposed surfaces of said workpiece and coating a surface substantially perpendicular to said two opposed surfaces.

4. The process of claim 1 wherein said rotating step causes said workpiece to be tilted away from said rotational axis during a third portion of the coating cycle.

5. The process of claim 1 further comprising:
    said attaching step comprising attaching a plurality of workpieces to said fixture; and
    said coating step comprising rotating said fixture about its longitudinal axis so as to cause simultaneous rotation of said workpieces about their respective longitudinal axes.

6. The process of claim 5 wherein at any time during the coating operation at least one workpiece is substantially parallel to said rotational axis and at least one other workpiece is tilted relative to said rotational axis and towards said coating source.

7. The process of claim 6 wherein said attaching step comprises placing each workpiece in a retaining device affixed to said fixture by a bushing and spindle arrangement and said fixture rotating step causing said spindles and said retaining devices to roll with respect to said fixture.

8. The process of claim 1 wherein said attaching step comprises placing said workpiece in a retaining device affixed to said fixture by a bushing and spindle arrangement and said fixture rotating step causing said spindle and said retaining device to roll with respect to said fixture.

9. The process of claim 1 wherein said coating step further comprises:
    applying sufficient heat to vaporize said coating material and to cause said coating material to contact surfaces of said workpiece.

10. A process for simultaneously forming a coating on a plurality of airfoils each having a leading edge, two opposed surfaces, and a platform substantially perpendicular to said opposed surfaces, the process comprising the steps of:
    providing a fixture having a plurality of retention devices affixed thereto by canted bushing and spindle arrangements which roll with respect to said fixture;
    placing one of said airfoils in each of said retention devices;
    attaching said fixture with said airfoils in said retention devices to a rotary drive system;
    transporting said fixture and said airfoils into a coating chamber having a source of coating material; and
    rotating said fixture about a rotational axis while coating is being applied to said airfoils and thereby causing said spindle arrangements to roll with respect to said fixture and each of said airfoils to rotate about its respective longitudinal axis, said rotating step causing during any portion of a coating operation at least one of said airfoils to have its respective longitudinal axis substantially parallel to said rotational axis and at least one other of said airfoils to have its respective longitudinal axis to be tilted relative to said rotational axis and towards said source of coating material.

11. The process of claim 10 wherein said rotating step comprises rotating said fixture about its longitudinal axis.

12. The process of claim 10 further comprising:
    applying heat to said coating material so as to cause said coating material to vaporize and contact surfaces of each airfoil.

13. An apparatus for forming a substantially uniform coating on a workpiece, said apparatus comprising:
    a modular fixture for coating a workpiece, said fixture having a rotational axis and said workpiece having a longitudinal axis; and
    said fixture having means for causing said workpiece to have said longitudinal axis tilted relative to said rotational axis and towards a source of coating material during a first portion of a coating operation and for causing said workpiece to have its longitudinal axis substantially parallel to said rotational axis during a second portion of said coating operation, said causing means causing said workpiece to rotate about said longitudinal axis when said modular fixture is rotated about said rotational axis.

14. The apparatus of claim 13 further comprising:
    said fixture having a first axis and at least one plate substantially perpendicular to said first axis; and
    said means for causing said workpiece to tilt and to be substantially parallel comprising a bushing inserted within said at least one plate, said bushing being canted relative to said first axis.

15. The apparatus of claim 14 further comprising:
    said means for causing said workpiece to tilt and to be substantially parallel further comprising a spindle arrangement cooperating with said bushing to cause said workpiece to tilt towards said coating source during a first portion of the coating operation and causing said workpiece to be substantially parallel with respect to said rotational axis during a second portion of the operation.

16. The apparatus of claim 15 further comprising:

said bushing comprising a sleeve member having a substantially circular bore; and said spindle arrangement comprising a pin having an enlarged end portion for contacting one end of said sleeve member and a shaft portion attached to said enlarged end portion, said shaft portion having an outer diameter less than the dimensions of said bore.

17. The apparatus of claim 16 further comprising said bore and said shaft portion both having roughened surfaces for creating friction which allows the workpiece to roll as said fixture is rotated.

18. The apparatus of claim 16 further comprising:

means for retaining said workpiece;

said means for retaining said workpiece having a connector at one end;

said connector having two opposed slots;

said shaft portion having at least one slot for mating with said two opposed connector slots; and means for securing said connector to said shaft portion.

19. The apparatus of claim 18 wherein said securing means comprises a wedge-shaped member passing through said connector slots and said at least one shaft portion slot.

20. The apparatus of claim 15 further comprising:

a workpiece holding device having a first wall and two side walls extending from said first wall, said side walls and said first wall defining an opening for receiving said workpiece; and a cover for closing said opening after said workpiece has been placed within said holding device.

21. The apparatus of claim 20 further comprising:

a tongue-like member attached to and protruding from one of said side walls, said tongue-like member having a slot therein; and said cover having a slot through which said tongue-like member passes when said cover closes said opening.

22. The apparatus of claim 21 further comprising:

a wedge member for securing said cover; and said wedge member passing through said slot in said tongue like member and contacting portions of the exterior surface of said cover.

23. The apparatus of claim 20 further comprising:

means for positioning said workpiece within said workpiece holding device.

24. The apparatus of claim 23 wherein said positioning means comprises a positioning member attached to the first wall, said positioning member cooperating with a portion of the workpiece.

25. The apparatus of claim 23 wherein said positioning means comprises a positioning member extending between said first wall and one of said side walls, said positioning member cooperating with a portion of said workpiece.

26. The apparatus of claim 20 further comprising:

a masking device attached to said workpiece holding device; and said masking device extending over a portion of said workpiece not to be coated during the coating operation.

27. The apparatus of claim 13 further comprising:

means for securing said fixture to a means for rotating said fixture about said rotational.

28. An apparatus for forming a substantially uniform coating on a workpiece, said apparatus comprising:

a modular fixture for coating a workpiece, said fixture having a rotational axis and said workpiece having a longitudinal axis; and said fixture having means for causing said workpiece to have said longitudinal axis tilted relative to said rotational axis during a first portion of a coating operation and for causing said workpiece to have said longitudinal axis substantially parallel to said rotational axis during a second portion of said coating operation, said causing means causing said workpiece to rotate about said longitudinal axis when said modular fixture is rotated.

29. The apparatus of claim 28 wherein said means for causing said workpiece to tilt further comprises means for causing said workpiece to tilt away from said rotational axis and a coating source during a third portion of said coating operation.

30. The apparatus of claim 28 wherein said rotational axis is the longitudinal axis of said fixture.

31. The apparatus of claim 28 wherein said means for causing said workpiece to tilt relative to said rotational axis during a first portion of said coating operation and to be substantially parallel to the rotational axis during a second portion of said coating operation comprises a canted bushing and spindle arrangement.

* * * * *